(12) United States Patent
Shin et al.

(10) Patent No.: US 7,449,936 B2
(45) Date of Patent: Nov. 11, 2008

(54) OPEN-LOOP SLEW-RATE CONTROLLED OUTPUT DRIVER

(75) Inventors: Dong-Suk Shin, Kyoungki-do (KR); In-Hwa Jung, Kyoungki-do (KR); Jin-Han Kim, Kyoungki-do (KR); Chulwoo Kim, Kyoungki-do (KR); Hyung-Dong Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 126 days.

(21) Appl. No.: 11/482,684

(22) Filed: Jul. 6, 2006

(65) Prior Publication Data

US 2007/0069784 A1 Mar. 29, 2007

(30) Foreign Application Priority Data

Sep. 28, 2005 (KR) .............. 10-2005-0090853
Dec. 29, 2005 (KR) .............. 10-2005-0133986

(51) Int. Cl.
*H03K 17/14* (2006.01)
(52) U.S. Cl. .................. 327/378; 327/262; 327/170
(58) Field of Classification Search ............. 327/170, 327/108, 112, 378, 262–264
See application file for complete search history.

(56) References Cited

U.S. PATENT DOCUMENTS

| | | | |
|---|---|---|---|
| 6,047,346 A | 4/2000 | Lau et al. | |
| 6,275,069 B1 * | 8/2001 | Chung et al. | 326/98 |
| 6,556,052 B2 | 4/2003 | Garrett, Jr. et al. | |
| 6,784,708 B1 | 8/2004 | Krenzke | |
| 6,819,157 B2 * | 11/2004 | Cao et al. | 327/262 |
| 6,870,419 B1 | 3/2005 | Garrett, Jr. et al. | |
| 6,903,589 B2 * | 6/2005 | Kim | 327/170 |
| 6,906,567 B2 * | 6/2005 | Culler | 327/170 |
| 7,035,148 B2 * | 4/2006 | Chung et al. | 365/189.05 |
| 7,109,768 B2 * | 9/2006 | Rashid | 327/170 |
| 7,142,027 B2 * | 11/2006 | Lee et al. | 327/158 |
| 2002/0135405 A1 | 9/2002 | Chen | |
| 2003/0042953 A1 | 3/2003 | Shin | |

FOREIGN PATENT DOCUMENTS

JP     2003-179480     6/2003

* cited by examiner

*Primary Examiner*—Lincoln Donovan
*Assistant Examiner*—Hai L Nguyen
(74) *Attorney, Agent, or Firm*—Blakely, Sokoloff, Taylor & Zafman

(57) ABSTRACT

A slew-rate controlled output driver for use in a semiconductor device includes a PVT variation detection unit having a delay line for receiving a reference clock in order to detect a delay amount variation of the delay line determined according to process, voltage and temperature (PVT) variation; a selection signal generation unit for generating a driving selection signal which corresponds to a detection signal generated by the PVT variation detection unit; and an output driving unit having a plurality of driver units controlled by an output data and the driving selection signal for driving an output terminal with a driving strength which corresponds to the PVT variation.

15 Claims, 7 Drawing Sheets

OPEN-LOOP SLEW-RATE CONTROLLED OUTPUT DRIVER

FIELD OF THE INVENTION

The present invention relates to an output driver for use in a semiconductor device; and, more particularly, to an open-loop slew-rate controlled output driver.

DESCRIPTION OF RELATED ARTS

An output driver is a circuit for driving an output pad to which a predetermined load is connected in order to output a data from a semiconductor device. Generally, a push-pull type driver is widely used as the output driver. In connection with a control of the push-pull type output driver, a control of a slew rate has been the issue.

The slew rate shows how fast voltage level of an output signal changes. The slew rate is defined as a slope showing a ratio between a voltage level change and a unit time.

Meanwhile, the slew rate can be classified into two types: one is an up slew rate and the other is a down slew rate. The up slew rate shows a slope when the voltage level of the output signal changes from a low level to a high level. On the other hand, the down slew rate shows a slope when the voltage level of the output signal changes from a high level to a low level. In either case, the greater the slew rate is, the steeper the slope of the output signal is. That is, the voltage level of the output signal is changed within a short time.

FIG. 1 is a schematic circuit diagram showing a conventional push-pull type output driver.

As shown, the conventional push-pull type output driver includes a pull-up p-type metal oxide semiconductor (PMOS) transistor MP1 and a pull-down n-type metal oxide semiconductor (NMOS) transistor MN1 for performing a charging operation, i.e., a pull-up operation, and a discharging operation, i.e., a pull-down operation, to a load capacitor $C_L$.

According to the conventional push-pull type output driver, a higher slew-rate is advantageous in view of a data skew. However, if the slew-rate is increased, a switching noise is also increased due to inductances L1 and L2 seen by a pin. On the other hand, if the slew-rate is decreased, the switching noise is decreased; however, the data skew is increased. If the increase of the data skew is serious, a signal level of an output signal may be changed before the output signal reaches a peak point.

Therefore, it is important to design the conventional push-pull type output driver so that the slew-rate can be appropriately controlled.

FIG. 2 is a schematic circuit diagram depicting another conventional push-pull type output driver having a pre-driver for controlling a slew-rate.

As shown, the conventional push-pull type output driver includes a main driver having a pull-up PMOS transistor MP1 and a pull-down NMOS transistor MN1; and a pre-driver 20 connected to the main driver.

The pre-driver 20 includes a transistor whose size is different from that of the main driver. By using this size difference, a slew-rate of an output signal can be fixed by controlling an increase/decrease timing of an output DRV outputted from the pre-driver 20.

However, in this case, variations of process, voltage and temperature (PVT) cause a drawback. That is, a slew-rate may be greatly varied having a maximum value about three times larger than a minimum value under a slow condition and a fast condition. The above-mentioned slew-rate variation has a negative effect on signal integrity.

Accordingly, a technology for maintaining a slew-rate regardless of the PVT variation has been developed.

FIG. 3 is a schematic circuit diagram illustrating another conventional push-pull type output driver for controlling a slew-rate by adjusting a waveform at a pre-driving node.

Referring to FIG. 3, the conventional push-pull type output driver includes a pre-driver unit for pre-driving a data signal IN in response to an enable signal en and a digital weight dw; a pre-driving node waveform control unit for adjusting a capacitance of the pre-driving node in response to control codes, e.g., c0, c1, f0, f1 and f2, determined according to the PVT variations; a main driver unit for driving an output pad in response to a voltage level of the pre-driving node.

The conventional push-pull type output driver shown in FIG. 3 controls a slew-rate by adjusting a waveform at the pre-driving unit. That is, if a slew-rate of the pre-driving node is maintained as a constant value, a slew-rate of the main driver unit driven by the pre-driving node can be maintained as a constant value.

The pre-driving node waveform control unit uses the control codes generated by a PVT detection circuit (not shown) in order to control the capacitance of the pre-driving node. Herein, when a value of the control code is increased, the capacitance of the pre-driving node is increased so that a slew-rate is decreased. On the other hand, when the value of the control code is decreased, the capacitance of the pre-driving node is decreased so that the slew-rate is increased.

Accordingly, the slew-rate can be controlled to be insensitive to the PVT variations. However, in this case, lots of power consumption is required to charge/discharge the capacitance of the pre-driving node.

Meanwhile, for the capacitance of the pre-driving node to be seen as a pure capacitance, a resistance of switching transistors should be very low. Accordingly, a size of a transistor should be large and, thus, parasitic elements are increased preventing a high-speed operation.

Meanwhile, an output driver for controlling a slew-rate by using a phase-locked loop (PLL) has been disclosed at the JSSC in 2003. This output driver increases an operational speed and reduces a power consumption for charging/discharging in comparison with a conventional output driver.

However, since the PLL is included, it is difficult to accurately detect the PVT variations due to a jitter accumulation. It is also difficult to design the output driver since it is a high order system. Further, since the output driver is a closed-loop circuit having a voltage controlled oscillator (VCO), it takes lots of time to complete a locking operations and a size of a chip is increased.

For another example, an output driver included in A-1 Gb/s/pin 512-MB DDR2 SDRAM for controlling a slew-rate by generating a signal from a delay-locked loop (DLL) has been disclosed at the JSSC in 2003. In comparison with using the PLL, a locking time is relatively decreased; however, since the output driver also includes an analog block like the PLL-included output driver, a large size is required and power consumption is increased.

Meanwhile, an output driver having a speed-locked loop (SLL) has been disclosed at the ISSCC in 2004. In this case, since the output driver has a digital structure, it is relatively easy to design the output driver. However, since the output driver is a closed-loop circuit like the PLL-included and the DLL-included output drivers, a required time for completing the locking operation is long.

SUMMARY OF THE INVENTION

It is, therefore, an object of the present invention to provide an output driver capable of controlling a slew-rate having an open-loop structure excluding an analog block and a method thereof.

In accordance with an aspect of the present invention, there is provided a slew-rate controlled output driver for use in a semiconductor device, including: a PVT variation detection unit having a delay line for receiving a reference clock in order to detect a delay amount variation of the delay line determined according to process, voltage and temperature (PVT) variation; a selection signal generation unit for generating a driving selection signal which corresponds to a detection signal generated by the PVT variation detection unit; and an output driving unit having a plurality of driver units controlled by an output data and the driving selection signal for driving an output terminal with a driving strength which corresponds to the PVT variation.

In accordance with another aspect of the present invention, there is provided a method for driving an output of a semiconductor device, including the steps of: a) detecting a delay amount variation of a delay line according to process, voltage and temperature (PVT) variation, the delay line receiving a reference clock; b) generating a driving selection signal which corresponds to the detection result of the step a); c) driving an output terminal with a driving strength which corresponds to the PVT variation by controlling a plurality of driver units by an output data and the driving selection signal, wherein the driver units have a different driving strength.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, an output driver in accordance with the present invention will be described in detail referring to the accompanying drawings.

Figure 1:
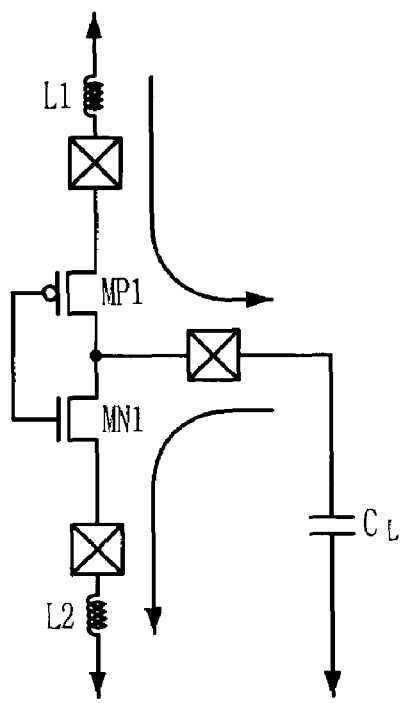
FIG. 1 is a schematic circuit diagram showing a conventional push-pull type output driver.
Figure 2:
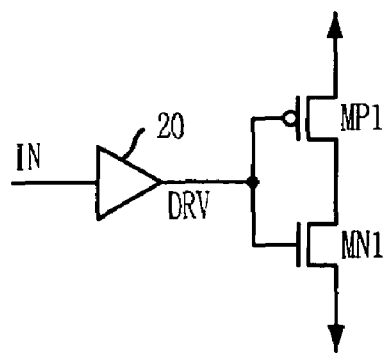
FIG. 2 is a schematic circuit diagram depicting another conventional push-pull type output driver having a pre-driver for controlling a slew-rate.
Figure 3:
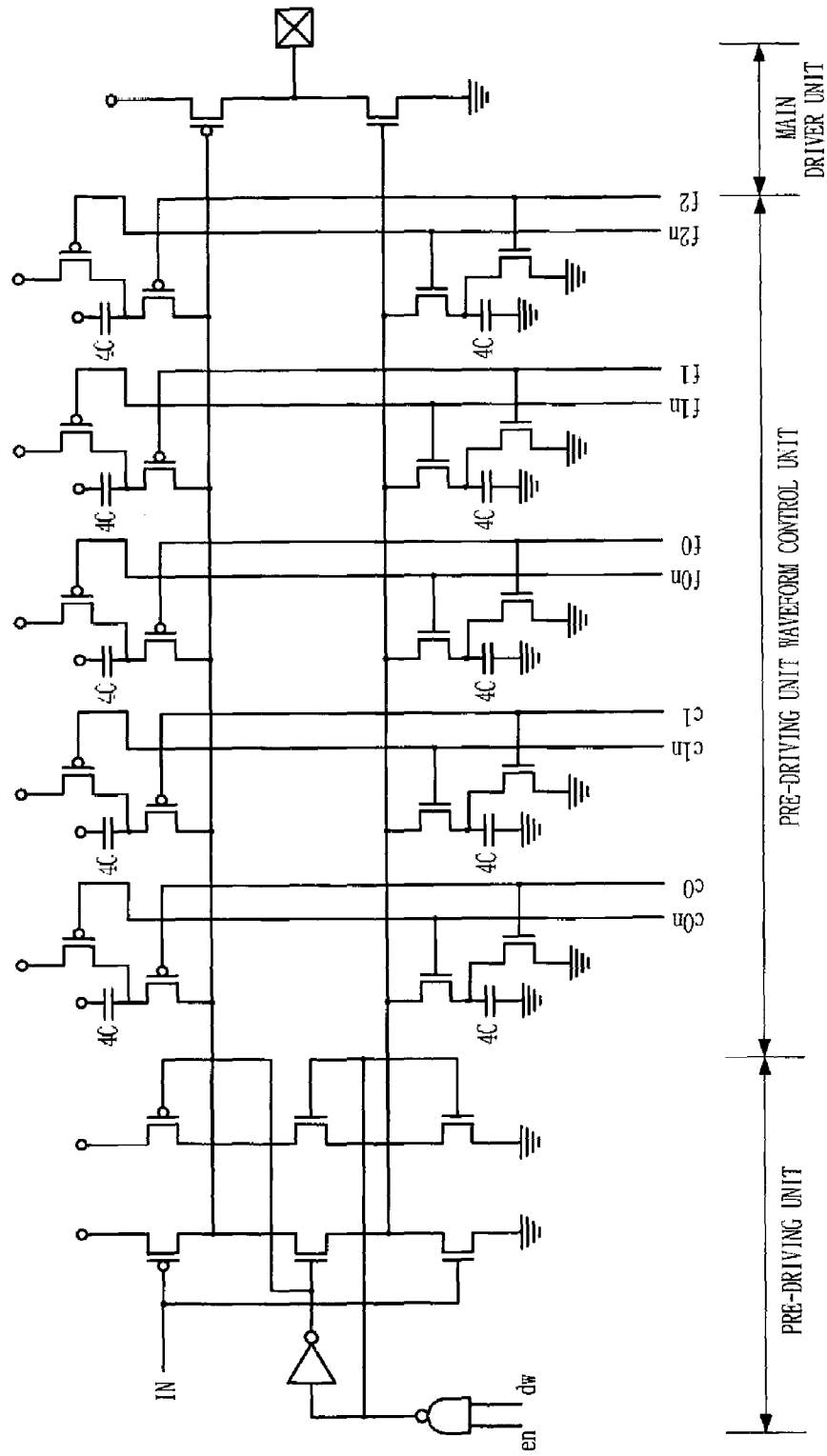
FIG. 3 is a schematic circuit diagram illustrating another conventional push-pull type output driver for controlling a slew-rate by adjusting a waveform at a pre-driving node.
Figure 4:
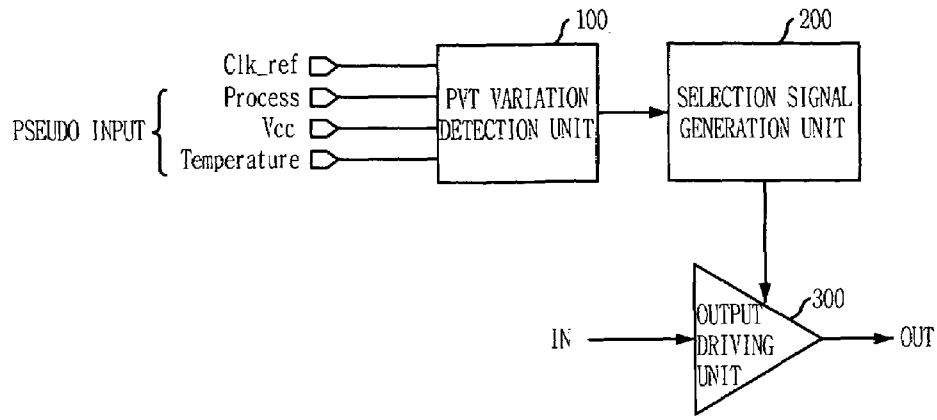
FIG. 4 is a block diagram showing a slew-rate controlled output driver in accordance with a preferred embodiment of the present invention.

FIG. 4 is a block diagram showing a slew-rate controlled output driver in accordance with a preferred embodiment of the present invention.

As shown, the slew-rate controlled output driver includes a delay line for receiving a reference clock clk_ref; a PVT (process, voltage and temperature) variation detection unit 100 for detecting a condition variation of the delay line due to a PVT variation; a selection signal generation unit 200 for generating a driving selection signal which corresponds to a detection signal generated by the PVT variation detection unit 100; and an output driving unit 300 having a plurality of driving terminals controlled by an output data and the driving selection signal for driving an output terminal with a driving strength which corresponds to the PVT variation, wherein, the driving terminals have a different driving strength.

Herein, the PVT variation detection unit 100 does not receive a particular signal which indicates a condition of the PVT; however, the delay line has a different delay amount according to the condition of the PVT and the PVT variation detection unit 100 uses the delay amount of the delay line for detecting the PVT variation. Therefore, the input of process, voltage and temperature is expressed as a pseudo input in FIG. 4.

Figure 5:
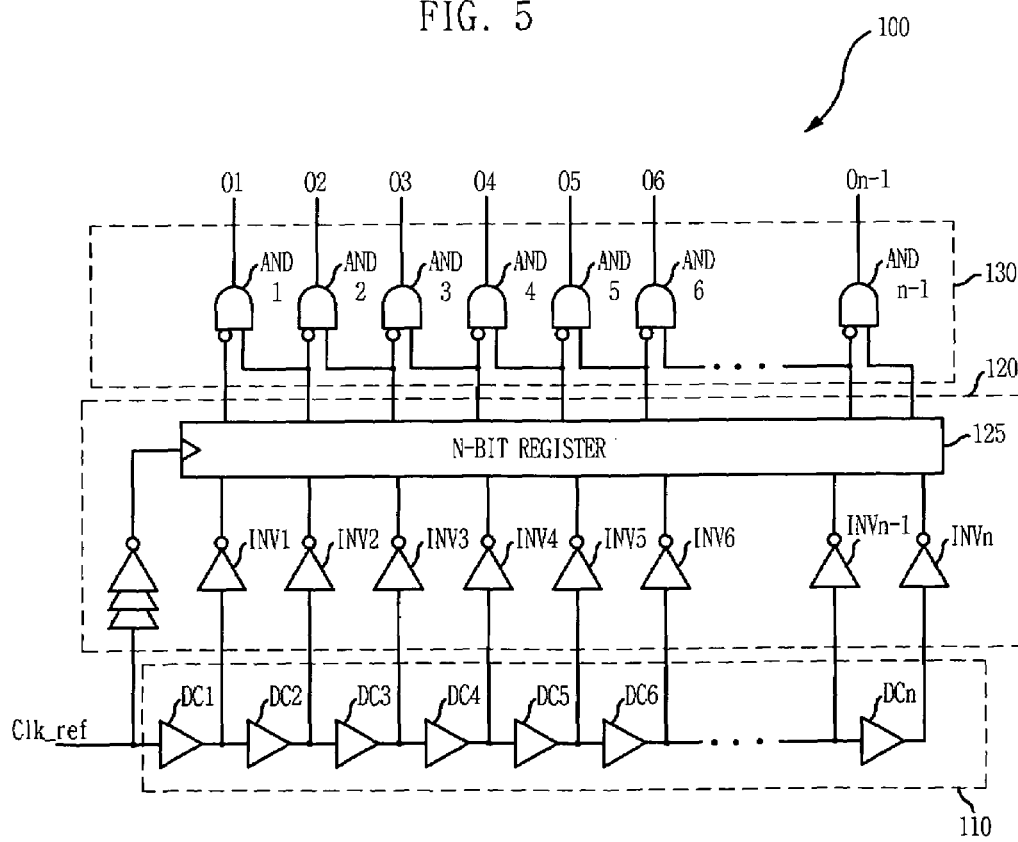
FIG. 5 is a block diagram depicting the PVT variation detection unit shown in FIG. 4.

FIG. 5 is a block diagram depicting the PVT variation detection unit 100 shown in FIG. 4.

As shown, the PVT variation detection unit 100 includes a delay line 110 for receiving the reference clock clk_ref in order to generate a multiple phase clock signal having a constant phase difference; a digitizer 120 for digitizing a level of the multiple phase clock signal generated by the delay line 110; and a switching detection unit 130 for detecting a switching point of an output of the digitizer 120.

Herein, the delay line 110 includes open-loop connected n delay cells, i.e., DC1 to DCn, for receiving the reference clock clk_ref. It is preferable to embody each delay cell with two static inverters connected in series whose circuit structure is same to that of the output driver so that the delay cell has a characteristic which is same to the PVT variation characteristic of the output driver. By using a static inverter for embodying the delay cell, power consumption can be reduced and a high-impedance state can be prevented.

The digitizer 120 includes n inverters, i.e., INV1 to INVn, for receiving the multiple phase clock signal outputted from the delay cells DC1 to DCn included in the delay line 110; and an N-bit register 125 for latching an output of the n inverters INV1 to INVn in response to the reference clock clk_ref.

The switching detection unit 130 performs an exclusive logic OR operation to two neighboring bits of the N-bit register 125 to thereby detect the switching point of the output of the digitizer 120. As shown in FIG. 5, the switching detection unit 130 includes n−1 inverters for inverting each output of the N-bit register 125 (marked as an inverting sign in FIG. 5); and n−1 AND gates, i.e., AND1 to ANDn−1, for performing a logic AND operation to an inverted version of each bit outputted from the n−1 inverters and a next bit of the each bit to thereby generate the detection signal, i.e., 0<1:n−1>. Since a next bit of the last bit of the N-bit register 125 does not exist, n−1 inverters and n−1 AND gates are included.

Meanwhile, the N-bit register 125 included in the digitizer 120 can be embodied with n D-type flip-flops (F/F) for receiving outputs of the inverters INV1 to INVn as data inputs and for receiving delayed signals of the reference clock clk_ref as clock inputs.

Figure 6:
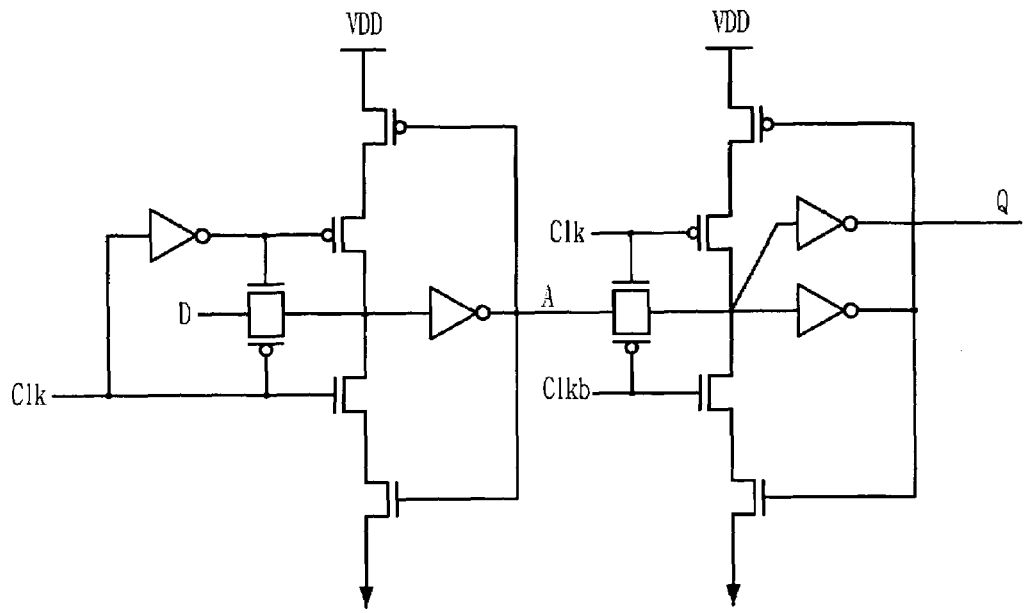
FIG. 6 is a schematic circuit diagram showing the commercial PowerPC 603 master-slave latch.

The D-type flip-flop can be easily embodied with a commercial PowerPC 603 master-slave latch shown in FIG. 6.

The PowerPC 603 master-slave latch is a flip-flop having a short direct path and a low power feedback. When a clock Clk is in a logic low level, a transmission gate served as a switch of a master latch is opened so that an input D is transferred to a node A, and a clocked inverter of a slave latch is turned on so that an output Q is maintained at a previous state.

Figure 7:
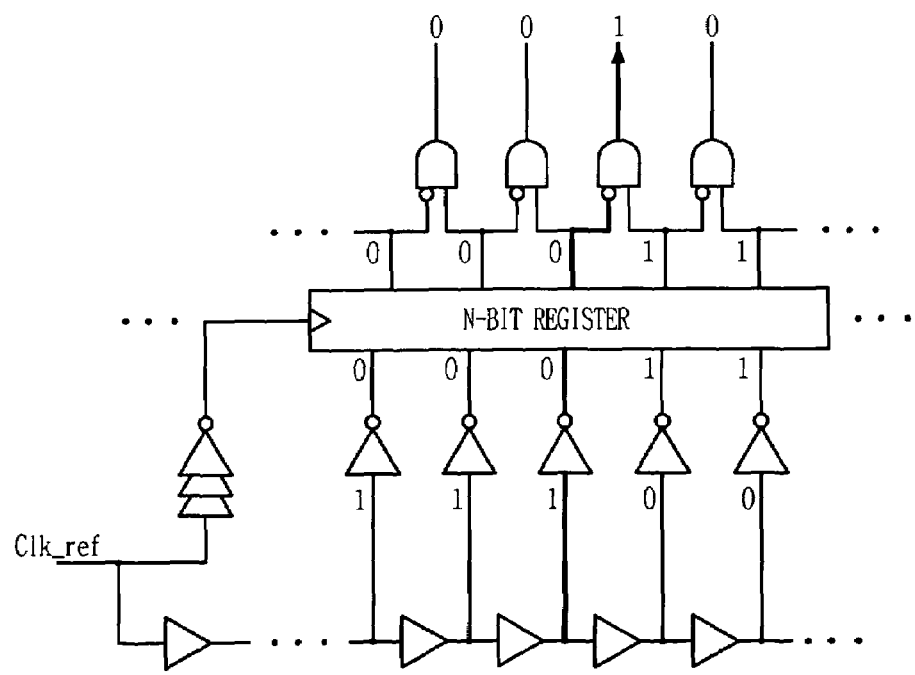
FIG. 7 is a block diagram showing an operation of the PVT variation detection unit shown in FIG. 5.

FIG. 7 is a block diagram showing an operation of the PVT variation detection unit 100 shown in FIG. 5.

On the assumption that the number of delay cells included in the delay line 110 is 20, the delay line 110 receives the reference clock clk_ref to generate 20 multiple phase clocks having a constant phase difference.

Meanwhile, if the multiple phase clocks are captured at a particular phase, a transition point where each multiple phase clock is changed from '1' to '0' is generated. All the multiple phase clocks have predetermined voltage levels between a power supply voltage Vdd and a ground voltage Vss not including voltage levels of the power supply voltage Vdd and the ground voltage Vss.

However, through each inverter included in the digitizer 120, the multiple phase clocks have a digital value of '1' or '0' due to a regenerative characteristic of an inverter. These digital values are latched by the N-bit register 125. This point of latching time, i.e., a point of time of capturing the multiple phase clocks, is determined by a delay amount by which the reference clock clk_ref is delayed (shown as a plurality of inverters overlapped in FIG. 7).

Meanwhile, the inverters included in the digitizer 120 prevents a load capacitance from being changed when the D-type flip-flops included in the N-bit register 125 switch so that a delay amount of the delay cell can be maintained as a constant delay amount ($\tau$) regardless of a data even though the data is changed to '1' or '0'.

Meanwhile, the switching detection unit 130 detects a transition point where an output of the N-bit register 125 is changed from '0' to '1'. That is, in view of the delay cell, the delay cell whose output is changed from '1' to '0' is detected. Accordingly, since only points where an output of the N-bit register 125 is changed from '0'to '1' are detected, the exclusive logic OR gate can be simply embodied with an inverter and an AND gate.

As a result, the PVT variation detection unit 100 detects the PVT variation by detecting the delay variation, which is changed according to the PVT variation, of the delay line 110. In other words, the PVT variation detection unit 100 counts the number of the delay cells each of which outputs '1' under a current PVT condition.

Figure 8:
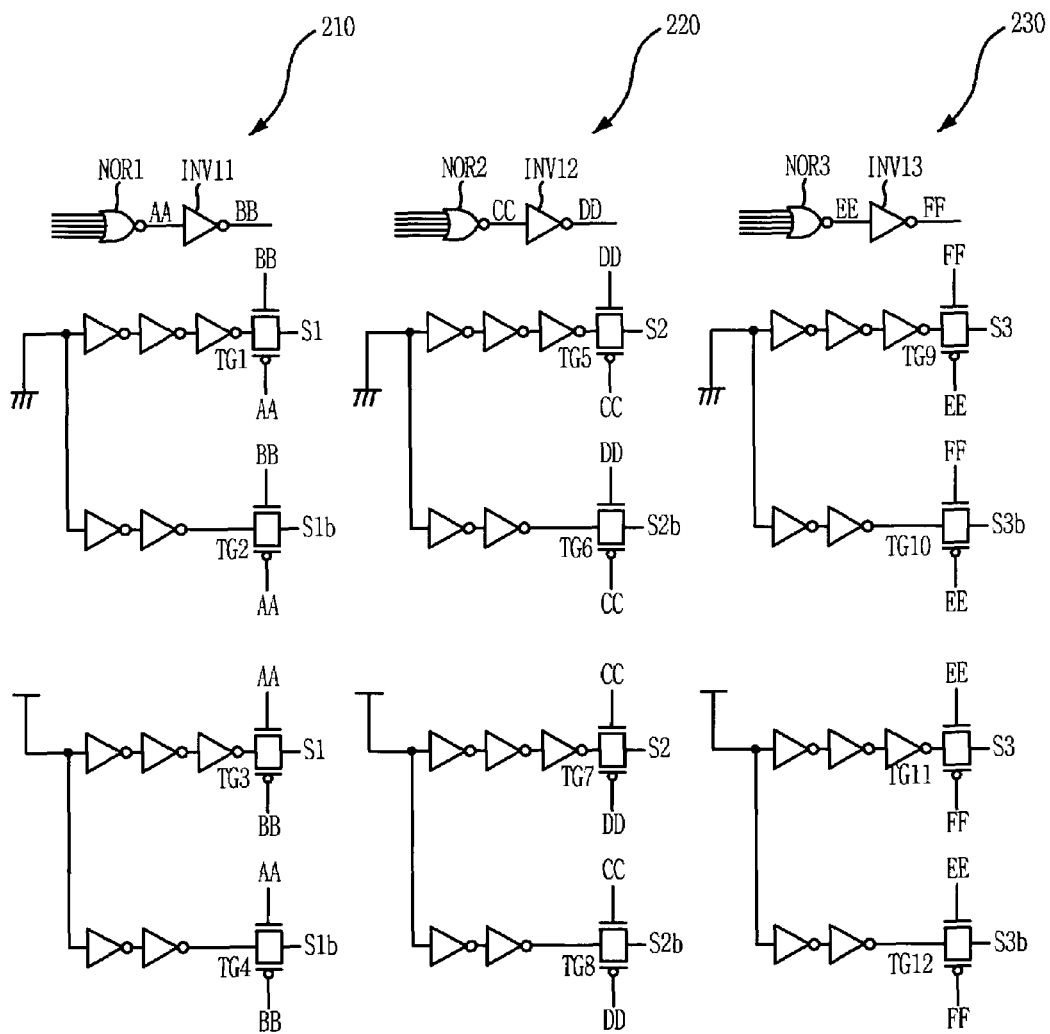
FIG. 8 is a schematic circuit diagram depicting the selection signal generation unit shown in FIG. 4.

FIG. 8 is a schematic circuit diagram depicting the selection signal generation unit 200 shown in FIG. 4.

As shown, the selection signal generation unit 200 includes a first to a third driving selection signal generation units 210 to 230 for respectively generating a first to a third pull-up/pull-down driving selection signals S1/S1*b* to S3/S3*b* in response to a portion of bits of the detection signal.

As above-mentioned, it is assumed that the number of the delay cells is 20. In this case, 19-bit detection signal 0<1:19> is generated by the switching detection unit 130 included in the PVT variation detection unit 100.

In detail, the first driving selection signal generation unit 210 includes a first NOR gate NOR1 for receiving bits 0<5:9> among the detection signal bits 0<1:19>; a first transmission gate TG1 for selectively outputting an inverted version of the ground voltage Vss as the first pull-up driving selection signal S1 in response to an output signal AA outputted from the first NOR gate NOR1 and an inverted version of the output signal AA, i.e., BB; a second transmission gate TG2 for selectively outputting the ground voltage Vss as the first pull-down driving selection signal S1*b* in response to the output signal AA and the inverted output signal BB; a third transmission gate TG3 for selectively outputting an inverted version of the power supply voltage Vdd as the first pull-up driving selection signal S1 in response to the output signal AA and the inverted output signal BB; and a fourth transmission gate TG4 for selectively outputting the power supply voltage Vdd as the first pull-down driving selection signal S1*b* in response to the output signal AA and the inverted output signal BB.

Herein, a group of the first and the second transmission gates TG1 and TG2 and a group of the third and the fourth transmission gates TG3 and TG4 are alternatively controlled so that the each output terminal of the first pull-up and pull-down driving selection signals S1 and S1*b* is prevented from being floated.

The second driving selection signal generation unit 220 includes a second NOR gate NOR2 for receiving bits 0<10:14> among the detection signal bits 0<1:19>; a fifth transmission gate TG5 for selectively outputting the inverted version of the ground voltage Vss as the second pull-up driving selection signal S2 in response to an output signal CC outputted from the second NOR gate NOR2 and an inverted version of the output signal CC, i.e., DD; a sixth transmission gate TG6 for selectively outputting the ground voltage Vss as the second pull-down driving selection signal S2*b* in response to the output signal CC and the inverted output signal DD; a seventh transmission gate TG7 for selectively outputting the inverted version of the power supply voltage Vdd as the second pull-up driving selection signal S2 in response to the output signal CC and the inverted output signal DD; and an eighth transmission gate TG8 for selectively outputting the power supply voltage Vdd as the second pull-down driving selection signal S2*b* in response to the output signal CC and the inverted output signal DD.

Herein, a group of the fifth and the sixth transmission gates TG5 and TG6 and a group of the seventh and the eighth transmission gates TG7 and TG8 are alternatively controlled so that the each output terminal of the second pull-up and pull-down driving selection signals S2 and S2*b* is prevented from being floated.

The third driving selection signal generation unit 230 includes a third NOR gate NOR3 for receiving bits 0<15:19> among the detection signal bits 0<1:19>; a ninth transmission gate TG9 for selectively outputting the inverted version of the ground voltage Vss as the third pull-up driving selection signal S3 in response to an output signal EE outputted from the third NOR gate NOR3 and an inverted version of the output signal EE, i.e., FF; a tenth transmission gate TG10 for selectively outputting the ground voltage Vss as the third pull-down driving selection signal S3*b* in response to the output signal EE and the inverted output signal FF; a eleventh transmission gate TG11 for selectively outputting the inverted version of the power supply voltage Vdd as the third pull-up driving selection signal S3 in response to the output signal EE and the inverted output signal FF; and a twelfth transmission gate TG12 for selectively outputting the power supply voltage Vdd as the third pull-down driving selection signal S3*b* in response to the output signal EE and the inverted output signal FF.

Herein, a group of the ninth and the tenth transmission gates TG9 and TG10 and a group of the eleventh and the twelfth transmission gates TG11 and TG12 are alternatively controlled so that the each output terminal of the third pull-up and pull-down driving selection signals S3 and S3*b* is prevented from being floated.

Meanwhile, the selection signal generation unit 200 shown in FIG. 8 is just an example. There are various methods for generating the driving selection signals by using the detection signal bits 0<1:19>.

When a transition occurs at an initial state of the delay cell, a compensation for the PVT variation is not required. Therefore, bits 0<1:4> among the detection signal bits 0<1:19> is not used as shown in FIG. 8. In this case, since a default driving operation is performed by the output driving unit 300, a particular driving selection signal is not required to be generated.

Figure 9:
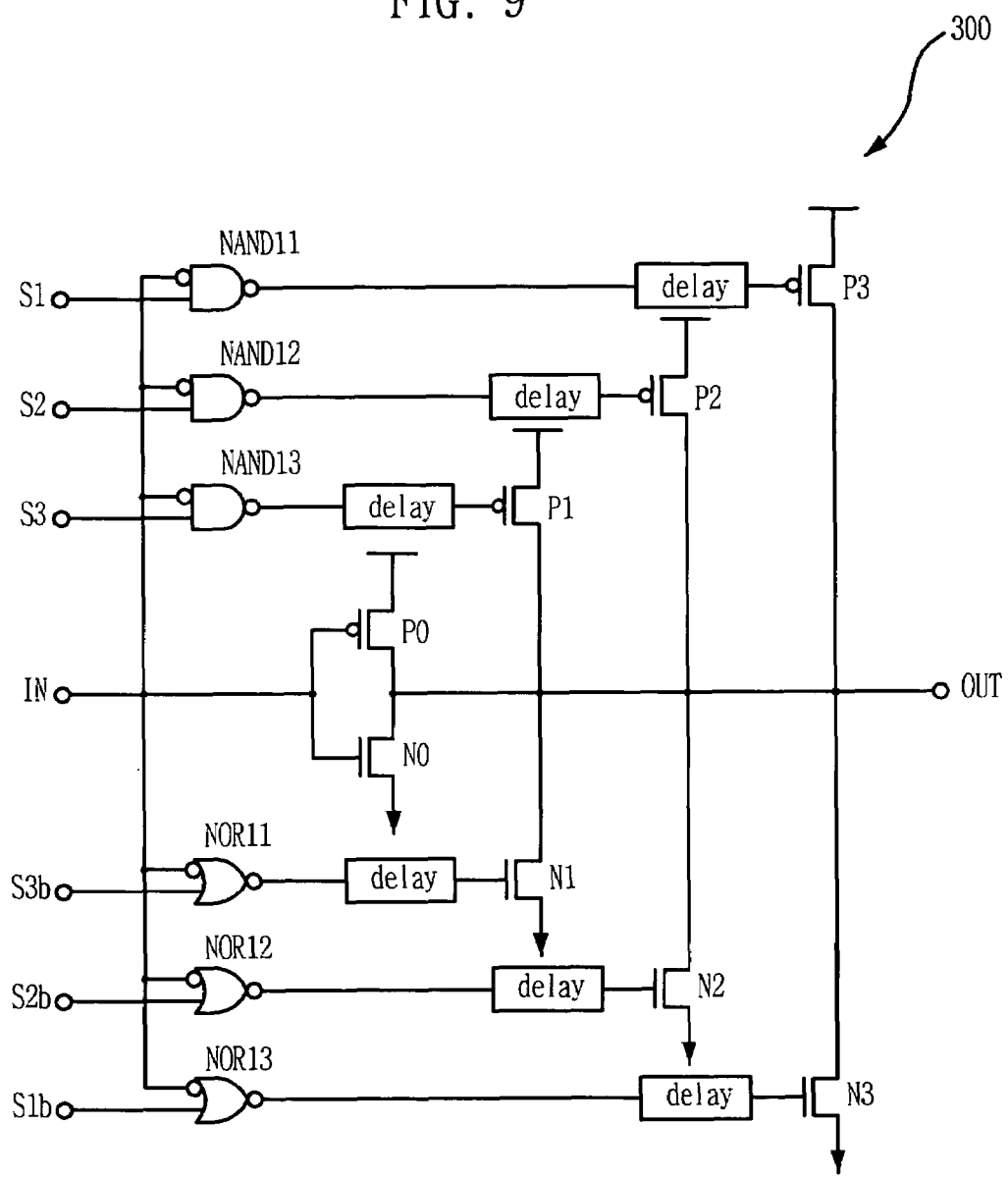
FIG. 9 is a block diagram showing the output driving unit shown in FIG. 4.

FIG. 9 is a block diagram showing the output driving unit 300 shown in FIG. 4.

As shown, the output driving unit 300 includes a default driver unit having a pull-up PMOS transistor P0 and a pull-down NMOS transistor N0 whose gates receive an output data IN; a first to a third auxiliary driver units respectively having first auxiliary pull-up PMOS and pull-down NMOS transistors P1 and N1, second auxiliary pull-up PMOS and pull-down NMOS transistors P2 and N2 and third auxiliary pull-up PMOS and pull-down NMOS transistors P3 and N3; an auxiliary pull-up control unit for generating an auxiliary pull-up control signal in response to the output data IN and the first to the third pull-up driving selection signals S1 to S3 in order to selectively turn on the first to the third auxiliary pull-up PMOS transistors P1 to P3; an auxiliary pull-down control unit for generating an auxiliary pull-down control signal in response to the output data IN and the first to the third pull-down driving selection signals S1b to S3b in order to selectively turn on the first to the third auxiliary pull-down NMOS transistors N1 to N3; and a plurality of delays for delaying the auxiliary pull-up and pull-down control signals for a predetermined time and for inputting the delayed signals to the first to the third auxiliary driver units.

The auxiliary pull-up control unit includes a first NAND gate NAND11 for receiving an inverted version of the output data IN and the first pull-up driving selection signal S1; a second NAND gate NAND12 for receiving the inverted version of the output data IN and the second pull-up driving selection signal S2; and a third NAND gate NAND13 for receiving the inverted version of the output data IN and the third pull-up driving selection signal S3.

The auxiliary pull-down control unit includes a fourth NOR gate NOR11 for receiving the inverted version of the output data and the first pull-down driving selection signal S1b; a fifth NOR gate NOR12 for receiving the inverted version of the output data and the second pull-down driving selection signal S2b; and a sixth NOR gate NOR13 for receiving the inverted version of the output data and the third pull-down driving selection signal S3b.

Meanwhile, the first to the third auxiliary driver units have a different driving strength. That is, the first auxiliary pull-up PMOS transistor P1 has the largest size and the third auxiliary pull-up PMOS transistor P3 has the smallest size among the first to the third auxiliary pull-up PMOS transistors P1 to P3. Likewise, the first auxiliary pull-down NMOS transistor N1 has the largest size and the third auxiliary pull-down NMOS transistor N3 has the smallest size among the first to the third auxiliary pull-down NMOS transistors N1 to N3.

Figure 10:
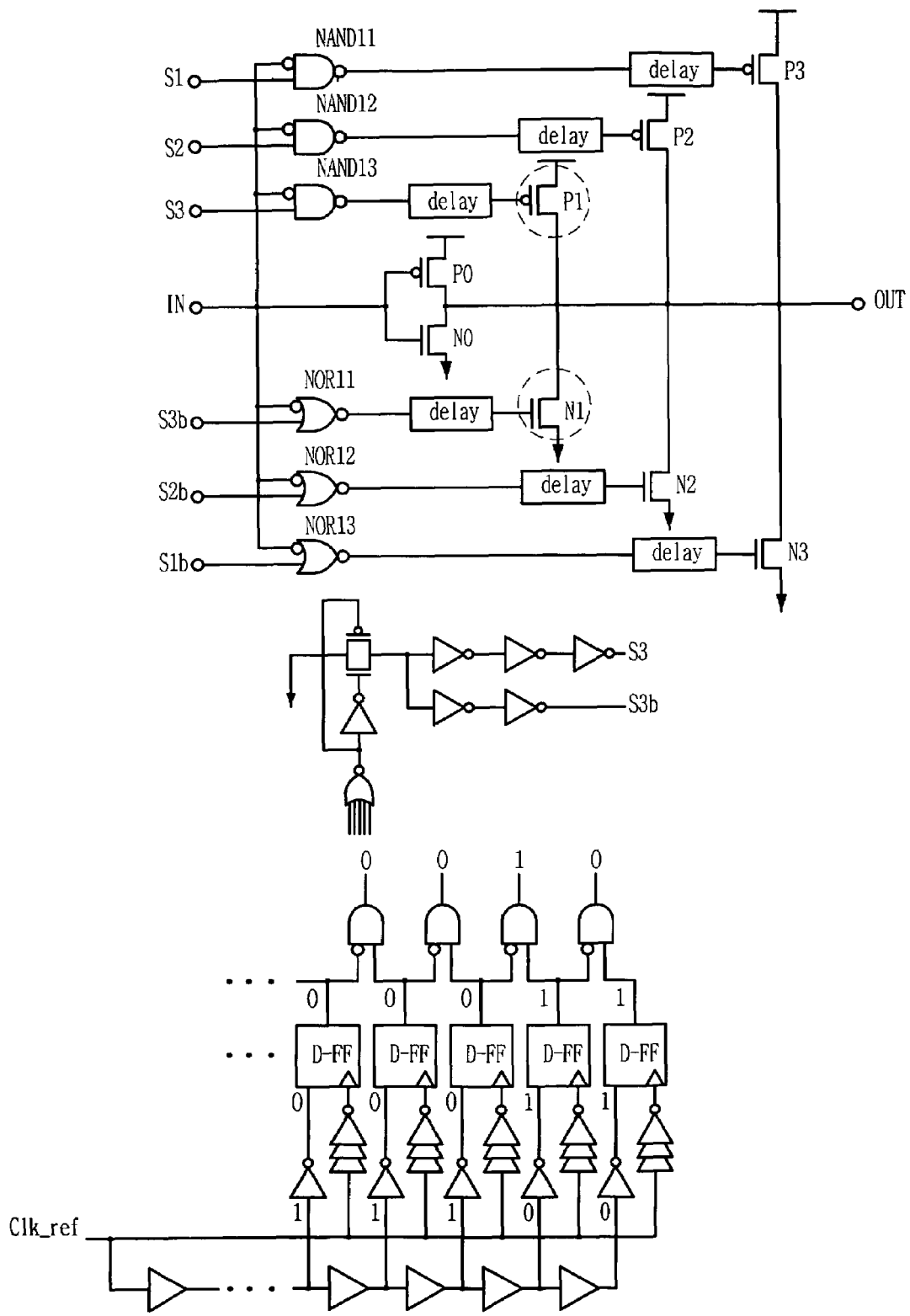
FIG. 10 is a block diagram showing an operation of the output driver shown in FIGS. 4 to 9.

FIG. 10 is a block diagram showing an operation of the output driver shown in FIGS. 4 to 9.

An operation of the PVT variation detection unit 100 has been described in detail referring to FIG. 5. In FIG. 10, a clock transition occurs at the 19th delay cell. In this case, only bit 0<18> outputted from the 18th AND gate among the detection signal bits 0<1:19> is '1' and the others are '0's.

Meanwhile, as above-mentioned referring to FIG. 8, the detection signal bit 0<18> is inputted to only the third driving selection signal generation unit 230 in the selection signal generation unit 200 and, thus, the third pull-up driving selection signal S3 is generated as a logic high level and the third pull-down driving selection signal S3b is generated as a logic low level by the third driving selection signal generation unit 230.

In this case, the first and the second pull-up driving selection signals S1 and S2 are inactivated as a logic low level and the first and the second pull-down driving selection signals S1b and S2b are inactivated as a logic high level.

Accordingly, the first auxiliary driver unit (P1, N1) is operated together with the default driver unit (P0, N0) for driving the output terminal. That is, if the output data IN is a logic low level, the first auxiliary pull-up PMOS transistor P1 is turned on in order to drive the output terminal with the default pull-up PMOS transistor P0. In this case, the default pull-up PMOS transistor P0 is firstly operated and, then, the first auxiliary pull-up PMOS transistor P1 is operated after a delay amount of the delay in order to drive the output terminal with the default pull-up PMOS transistor P0. Its two inverters are simultaneously turned on, a power noise is increased; however, the delay prevents the power noise from being increased.

Although it has been illustrated as an example that the default driver and the first auxiliary driver unit drive the output driver together when the third pull-up driving selection signal S3 and the third pull-down driving selection signal S3b are activated, another auxiliary driver unit can be selected or only the default driver unit without an auxiliary driver unit can be operated according to the detected PVT variation. When one bit of the detection signal bits 0<1:4> is activated, only the default driver unit is operated.

Meanwhile, the above-mentioned operation is started from a falling edge of the reference clock clk_ref and is completed until a next rising edge of the reference clock clk_ref. That is, since the open-loop structure is adopted, what is called the clock-on-demand can be satisfied, i.e., the PVT variation can be detected and the driving selection signal can be generated within one clock cycle.

According to the conventional PLL or DLL based output drivers, due to the analog method of charging/discharging, the locking time is relatively long and, thus, the clock-on-demand cannot be implemented. Further, since the analog block is included, chip size and power consumption are increased.

On the other hand, in accordance with the preferred embodiment of the present invention, since all circuits of the PVT variation detection unit 100 and the driving selection signal generation unit 200 are constructed with a CMOS digital logic, the output driver can be embodied with a small size, power consumption can be reduced and the output driver can be relatively easily designed.

In addition, a type and a position of the above-mentioned logic and MOS transistors can be changed according to an activation level of an input signal or an activation level of an output signal. Further, although the number of the delay cells is 20, the number of the delay cells can be changed to another number.

As a result, since a single cycle of a clock is enough time for a control of the output driver, a power consumption can be reduced through a power down. Further, in comparison with the conventional output driver, the output driver can be embodied with a smaller size.

The present application contains subject matter related to Korean patent application No. 2005-90853 and 2005-133986 filed in the Korea Patent Office on Sep. 28, 2005 and Dec. 29, 2005, respectively, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A slew-rate controlled output driver for use in a semiconductor device, comprising:
   a PVT variation detection unit for detecting a delay amount variation of a delay line determined according to process, voltage and temperature (PVT) variation, wherein the delay line receives a reference clock;
   a selection signal generation unit for generating a driving selection signal which corresponds to a detection signal detected by the PVT variation detection unit; and
   an output driving unit for driving an output terminal with a driving strength which corresponds to the PVT variation by controlling a plurality of driver units based on an output data and the driving selection signal, wherein the driver units have a different driving strength.

2. The slew-rate controlled output driver as recited in claim 1, wherein the PVT variation detection unit includes:
   the delay line for receiving the reference clock in order to generate a multiple phase clock signal having a constant phase difference;
   a digitizer for digitizing a level of the multiple phase clock signal; and
   a switching detection unit for detecting a switching point of an output of the digitizer.

3. The slew-rate controlled output driver as recited in claim 2, wherein the delay line includes a plurality of delay cells connected in series for receiving the reference clock.

4. The slew-rate controlled output driver as recited in claim 3, wherein each of the delay cells includes two static inverter circuits connected in series.

5. The slew-rate controlled output driver as recited in claim 2, wherein the digitizer includes:
   a plurality of first inverters for receiving the multiple phase clock signal outputted from the delay cells included in the delay line; and
   a multi-bit register for latching an output of the first inverters in response to the reference clock.

6. The slew-rate controlled output driver as recited in claim 5, wherein the multi-bit register includes a plurality of D-type flip-flops each of which receive an output of the first inverters as a data input and receives a delayed version of the reference clock as a clock input.

7. The slew-rate controlled output driver as recited in claim 5, wherein the switching detection unit includes a logic unit for performing an exclusive logic OR operation on each output bit of the multi-bit register and a next bit of the each output bit.

8. The slew-rate controlled output driver as recited in claim 7, wherein the switching detection unit includes:
   a plurality of second inverters for inverting each output bit of the multi-bit register; and
   a plurality of AND gates each for receiving an inverted version of the each output bit from the second inverters and the next bit of the each output bit in order to generate the detection signal.

9. The slew-rate controlled output driver as recited in claim 1, wherein the selection signal generation unit includes first to a third driving selection signal generation units for respectively generating first to a third pull-up and pull-down driving selection signals in response to partial bits of the detection signal.

10. The slew-rate controlled output driver as recited in claim 9, wherein the first driving selection signal generation unit includes:
    a NOR gate for receiving partial bits of the detection signal;
    a first transmission gate for selectively outputting an inverted version of a ground voltage as the first pull-up driving selection signal in response to an output signal of the NOR gate and an inverted output signal of the NOR gate;
    a second transmission gate for selectively outputting the ground voltage as the first pull-down driving selection signal in response to the output signal and the inverted output of the NOR gate;
    a third transmission gate for selectively outputting an inverted version of a power supply voltage as the first pull-up driving selection signal in response to the output signal and the inverted output signal of the NOR gate; and
    a fourth transmission gate for selectively outputting the power supply voltage as the first pull-down driving selection signal in response to the output signal and the inverted output signal of the NOR gate.

11. The slew-rate controlled output driver as recited in claim 9, wherein the output driving unit includes:
    a default driver unit having a pull-up PMOS transistor and a pull-down NMOS transistor whose gates receive the output data;
    a plurality of auxiliary driver units each having an auxiliary pull-up PMOS transistor and an auxiliary pull-down NMOS transistor, wherein each auxiliary pull-up PMOS transistor and each auxiliary pull-down NMOS transistor have a different size;
    an auxiliary pull-up control unit for generating an auxiliary pull-up control signal in response to the output data and the first to the third pull-up driving selection signals in order to selectively turn on the auxiliary pull-up PMOS transistor;
    an auxiliary pull-down control unit for generating an auxiliary pull-down control signal in response to the output data and the first to the third pull-down driving selection signals in order to selectively turn on the auxiliary pull-down NMOS transistor; and
    a plurality of delays for delaying the auxiliary pull-up and pull-down control signals for a predetermined time and for inputting the delayed signals to each of the auxiliary driver units.

12. The slew-rate controlled output driver as recited in claim 11, wherein the auxiliary pull-up control unit includes:
    a first NAND gate for receiving an inverted version of the output data and the first pull-up driving selection signal;
    a second NAND gate for receiving the inverted version of the output data and the second pull-up driving selection signal; and
    a third NAND gate for receiving the inverted version of the output data and the third pull-up driving selection signal.

13. The slew-rate controlled output driver as recited in claim 12, wherein the auxiliary pull-down control unit includes:
    a first NOR gate for receiving the inverted version of the output data and the first pull-down driving selection signal;
    a second NOR gate for receiving the inverted version of the output data and the second pull-down driving selection signal; and
    a third NOR gate for receiving the inverted version of the output data and the third pull-down driving selection signal.

14. A method for driving an output of a semiconductor device, comprising the steps of:

a) detecting a delay amount variation of a delay line according to process, voltage and temperature (PVT) variation, the delay line receiving a reference clock;
b) generating a driving selection signal which corresponds to the detection result of the step a); and
c) driving an output terminal with a driving strength which corresponds to the PVT variation by controlling a plurality of driver units by an output data and the driving selection signal, wherein the driver units have a different driving strength.

15. The method as recited in claim 14, wherein the step of a) includes the steps of:
d) generating a multiple phase clock signal having a constant phase difference by delaying the reference clock for a predetermined time at the delay line;
e) digitizing a level of the multiple phase clock signal; and
f) detecting a switching point where the digitized signal is changed.

* * * * *